United States Patent
Yang et al.

(10) Patent No.: US 9,756,768 B2
(45) Date of Patent: Sep. 5, 2017

(54) HEAT-DISSIPATING STRUCTURE MOUNTED ON BACK OF DISPLAY UNIT

(71) Applicant: LITEMAX ELECTRONICS INC., New Taipei (TW)

(72) Inventors: Tien-Teng Yang, New Taipei (TW); Chun-Hung Chen, New Taipei (TW)

(73) Assignee: LITEMAX ELECTRONICS INC. (TW)

( * ) Notice: Subject to any disclaimer, the term of this patent is extended or adjusted under 35 U.S.C. 154(b) by 7 days.

(21) Appl. No.: 14/934,212

(22) Filed: Nov. 6, 2015

(65) Prior Publication Data

US 2017/0135253 A1    May 11, 2017

(51) Int. Cl.
H05K 7/20    (2006.01)

(52) U.S. Cl.
CPC .............................. *H05K 7/20972* (2013.01)

(58) Field of Classification Search
CPC ........... H05K 7/20954; H05K 7/20972; H05K 7/20963; G06F 1/20
See application file for complete search history.

(56) References Cited

U.S. PATENT DOCUMENTS

| | | | |
|---|---|---|---|
| 2006/0132669 A1* | 6/2006 | Liou ................. | G02F 1/133308 349/58 |
| 2006/0132699 A1* | 6/2006 | Cho ...................... | F04D 29/582 349/161 |
| 2006/0290812 A1* | 12/2006 | Hsu ........................... | G06F 1/16 348/552 |
| 2007/0103909 A1* | 5/2007 | Park ................... | H05K 7/20972 362/294 |
| 2008/0078733 A1* | 4/2008 | Nearman ................. | G09F 9/33 211/189 |
| 2008/0083527 A1* | 4/2008 | Horng ................ | H05K 7/20972 165/80.3 |
| 2008/0218446 A1* | 9/2008 | Yamanaka ......... | H05K 7/20972 345/60 |
| 2009/0021126 A1* | 1/2009 | Chou ................. | H05K 7/20972 312/223.1 |

(Continued)

*Primary Examiner* — David M Sinclair
*Assistant Examiner* — Robert Brown
(74) *Attorney, Agent, or Firm* — Schmeiser, Olsen & Watts, LLP

(57) ABSTRACT

A heat-dissipating structure mounted on the back of a display unit is disposed at a rear portion of a high-brightness display unit. The heat-dissipating structure includes a casing disposed at the rear portion of the high-brightness display unit and separated therefrom by a gap; casing heat-dissipating holes disposed at the periphery of the casing and communicating with the gap; control chamber corresponding portion protrudingly disposed at the casing to receive a control chamber; a control chamber corresponding portion having an opening communicating with the gap; control chamber heat-dissipating holes penetratingly disposed at the control chamber corresponding portion and communicating with the gap via the opening; fan corresponding portions penetratingly disposed at the casing and communicating with the gap; and fans disposed at the fan corresponding portions, respectively, such that air introduced into the gap is discharged from the control chamber heat-dissipating holes and the casing heat-dissipating holes.

16 Claims, 2 Drawing Sheets

(56) References Cited

U.S. PATENT DOCUMENTS

Figure 1:
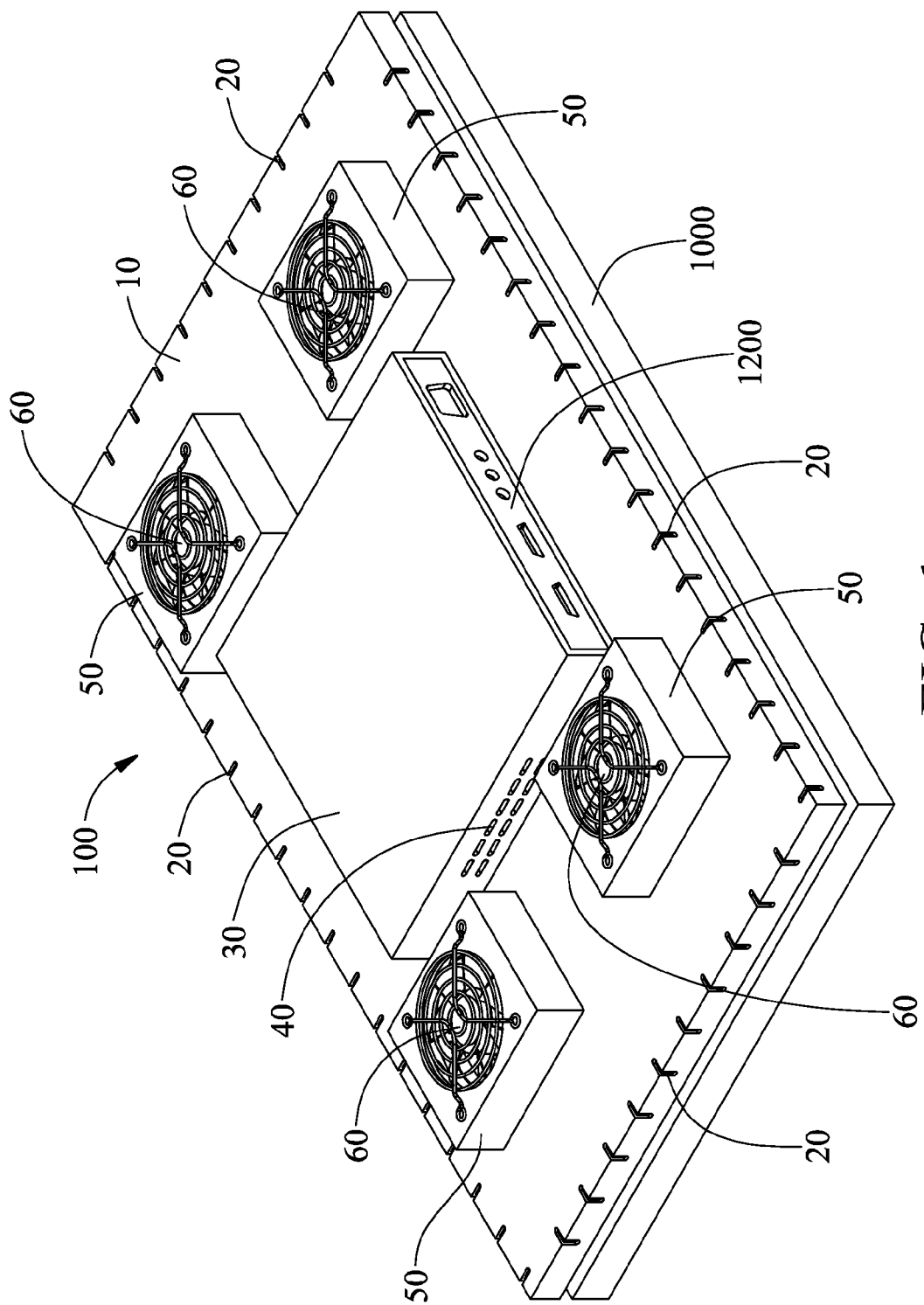

| | | | |
|---|---|---|---|
| 2009/0086430 A1* | 4/2009 | Kang | G02F 1/133385 361/695 |
| 2009/0175002 A1* | 7/2009 | Tseng | H05K 7/20972 361/694 |
| 2010/0172098 A1* | 7/2010 | Isoshima | H05K 7/20972 361/697 |
| 2011/0001898 A1* | 1/2011 | Mikubo | G02F 1/133385 349/58 |
| 2012/0236499 A1* | 9/2012 | Murayama | H05K 7/20972 361/696 |
| 2013/0314619 A1* | 11/2013 | Sugiura | H04N 5/64 348/836 |

* cited by examiner

HEAT-DISSIPATING STRUCTURE MOUNTED ON BACK OF DISPLAY UNIT

FIELD OF TECHNOLOGY

The present invention relates to heat-dissipating structures and more particularly to a heat-dissipating structure mounted on the back of a display unit to dissipate heat from the back of a high-brightness display unit.

BACKGROUND

A conventional high-brightness display unit generates heat readily and thus is predisposed to damage or even failure in the absence of an efficient heat dissipation mechanism.

According to the prior art, a conventional heat-dissipating structure of a high-brightness display unit is characterized in that a plurality of fans is disposed at the rear portion of the high-brightness display unit to carry out heat dissipate. However, as time passes by, hot air tends to accumulate inside the high-brightness display unit to thereby compromise heat dissipation.

Furthermore, the prior art does not design heat-dissipating holes to be small enough to prevent foreign bodies from intruding into the high-brightness display unit.

Furthermore, the conventional fans for use with the conventional heat-dissipating structure only deliver air current to the rear portion of the high-brightness display unit and thus cannot dissipate heat efficiently from the rear portion of the high-brightness display unit.

Accordingly, it is imperative to provide a heat-dissipating structure of a high-brightness display unit to efficiently dissipate heat from the rear portion of the high-brightness display unit.

SUMMARY

In view of the aforesaid drawbacks of the prior art, it is an objective of the present invention to provide a heat-dissipating structure mounted on the back of a display unit to efficiently dissipate heat from the rear portion of a high-brightness display unit.

In order to achieve the above and other objectives, the present invention provides a heat-dissipating structure mounted on the back of a display unit, for use at a rear portion of a high-brightness display unit, the heat-dissipating structure comprising: a casing covering the rear portion of the high-brightness display unit and separated from the rear portion of the high-brightness display unit by a gap; a plurality of casing heat-dissipating holes penetratingly disposed at a periphery of the casing and communicating with the gap, wherein each said casing heat-dissipating hole has is a portion thereof parallel to the rear portion of the high-brightness display unit and another portion thereof perpendicular to the rear portion of the high-brightness display unit; a control chamber corresponding portion protrudingly disposed at the casing, facing away from the rear portion of the high-brightness display unit to receive a control chamber electrically connected to the high-brightness display unit, and having an opening in communication with the gap; a plurality of control chamber heat-dissipating holes penetratingly disposed at the control chamber corresponding portion and communicating with the gap through the opening; a plurality of fan corresponding portions penetratingly disposed at the casing, communicating with the gap, and each rising in a direction away from the rear portion of the high-brightness display unit; and a plurality of fans disposed at the fan corresponding portions, respectively, wherein air introduced into the gap is discharged from the control chamber heat-dissipating holes and the casing heat-dissipating holes.

Regarding the heat-dissipating structure mounted on the back of a display unit, the control chamber heat-dissipating holes are penetratingly disposed in a sidewall of the control chamber corresponding portion.

Regarding the heat-dissipating structure mounted on the back of a display unit, the control chamber heat-dissipating holes and the casing heat-dissipating holes are oblong.

Regarding the heat-dissipating structure mounted on the back of a display unit, the control chamber heat-dissipating holes and the casing heat-dissipating holes are of a dimension of less than 2.5 mm.

Regarding the heat-dissipating structure mounted on the back of a display unit, the fan corresponding portions are penetratingly disposed in the casing and arranged symmetrically about the control chamber corresponding portion.

In conclusion, due to its aforesaid technical features, the present invention provides a heat-dissipating structure mounted on the back of a display unit to dissipate heat efficiently from a rear portion of a high-brightness display unit.

BRIEF DESCRIPTION

Figure 2:
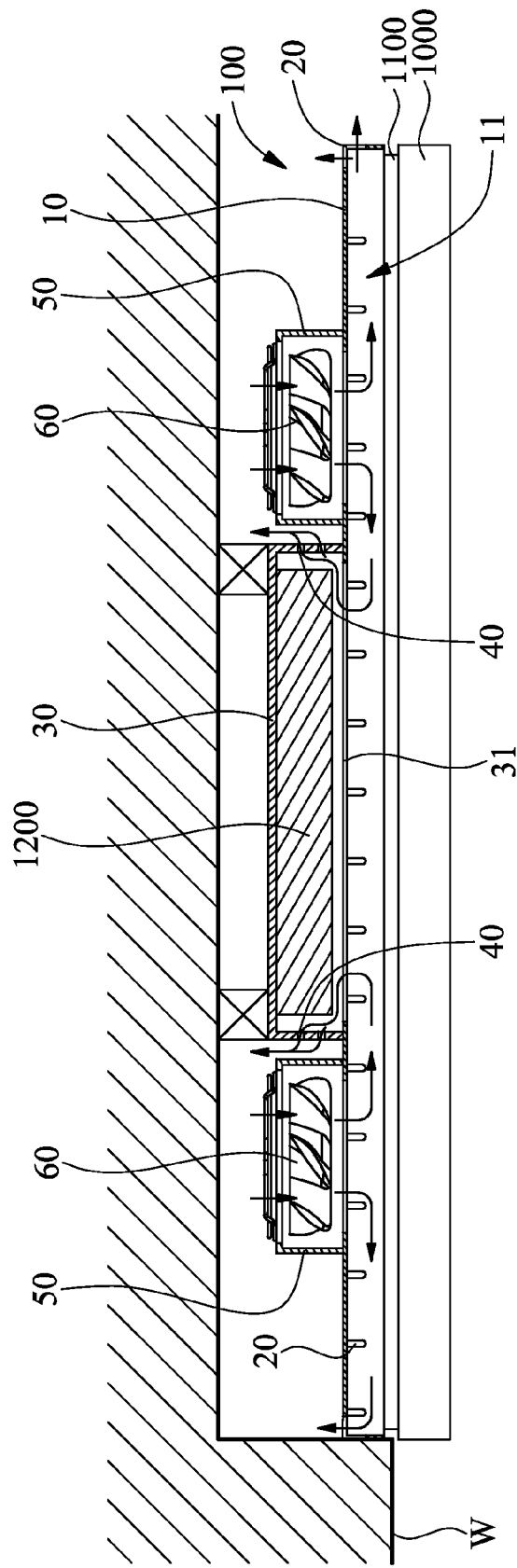

Objectives, features, and advantages of the present invention are hereunder illustrated with specific embodiments in conjunction with the accompanying drawings, in which:

FIG. 1 is a perspective view of a heat-dissipating structure mounted on the back of a display unit according to the present invention; and FIG. 2 is cross-sectional view of the heat-dissipating structure mounted on the back of a display unit according to the present invention.

DETAILED DESCRIPTION

Referring to FIG. 1 and FIG. 2, the present invention provides a heat-dissipating structure 100 mounted on the back of a display unit. The heat-dissipating structure 100 mounted on the back of the display unit applies to a rear portion 1100 of a high-brightness display unit 1000. The heat-dissipating structure 100 mounted on the back of a display unit comprises a casing 10, a plurality of casing heat-dissipating holes 20, a control chamber corresponding portion 30, a plurality of control chamber heat-dissipating holes 40, a plurality of fan corresponding portions 50 and a plurality of fans 60.

The casing 10 covers the rear portion 1100 of the high-brightness display unit 1000. The casing 10 is separated from the rear portion 1100 of the high-brightness display unit 1000 by a gap 11. The gap 11 is less than 2 cm in width.

The casing heat-dissipating holes 20 are penetratingly disposed at the periphery of the casing 10 and in communication with the gap 11. A portion of each casing heat-dissipating hole 20 is parallel to the rear portion 1100 of the high-brightness display unit 1000. Another portion of each casing heat-dissipating hole 20 is perpendicular to the rear portion 1100 of the high-brightness display unit 1000. Hence, if any side of the casing 10 is fixed to a wall to thereby block part of the casing heat-dissipating holes 20, heat can still be dissipated from the casing heat-dissipating holes 20 penetratingly disposed at the casing 10 and disposed on the other side of the casing 10.

The control chamber corresponding portion 30 is protrudingly disposed at the casing 10 and faces away from the rear portion 1100 of the high-brightness display unit 1000 to receive a control chamber 1200 electrically connected to the high-brightness display unit 1000. An opening 31 of the control chamber corresponding portion 30 is in communication with the gap 11.

The control chamber heat-dissipating holes 40 are penetratingly disposed in the control chamber corresponding portion 30 and communicate with the gap 11 through the opening 31.

The fan corresponding portions 50 are penetratingly disposed in the casing 10, communicate with the gap 11, each rise in the direction away from the rear portion 1100 of the high-brightness display unit 1000.

The fans 60 are disposed at the fan corresponding portions 50, respectively. After being introduced into the gap 11, air is discharged from the control chamber heat-dissipating holes 40 and the casing heat-dissipating holes 20.

Referring to FIG. 1, since the control chamber corresponding portion 30 and the fan corresponding portions 50 rise relative to the casing 10, the gap 11 formed between the casing 10 and the rear portion 1100 of the high-brightness display unit 1000 is narrow and extends in a manner to be parallel to the casing 10 and the rear portion 1100 of the high-brightness display unit 1000. After the fans 60 have introduced air from outside the casing 10 into the gap 11, the air is uniformly distributed within the gap 11 to thereby undergo complete heat exchange with the rear portion 1100 of the high-brightness display unit 1000. Then, the air is discharged from the casing heat-dissipating holes 20. In addition, after the fans 60 have introduced air from outside the casing 10 into the gap 11, the air moves to the control chamber 1200 via the opening 31 of the control chamber corresponding portion 30 to thereby dissipate heat from the control chamber 1200, and thus the air which is now cooled down is discharged from the control chamber heat-dissipating holes 40. Hence, the present invention is effective in dissipating heat.

When the high-brightness display unit 1000 is hung on a wall W, the control chamber heat-dissipating holes 40 penetratingly disposed on the sidewall of the control chamber corresponding portion 30 are effective in preventing the control chamber heat-dissipating holes 40 from being hidden by the wall W and thus preventing the deterioration of the efficiency of heat dissipation.

In an embodiment of the present invention, the control chamber heat-dissipating holes 40 and the casing heat-dissipating holes 20 are oblong, so as to enable the air to be discharged quickly and thus speed up heat dissipation.

In another embodiment of the present invention, the control chamber heat-dissipating holes 40 and the casing heat-dissipating holes 20 are less than 2.5 mm in width, so as to prevent large foreign bodies from intruding into the rear portion 1100 of the high-brightness display unit 1000 through the control chamber heat-dissipating holes 40 and the casing heat-dissipating holes 20.

To enhance convection and allow the air to be distributed within the gap 11 uniformly and move around quickly, the fan corresponding portions 50 are preferably penetratingly disposed in the casing 10 and arranged symmetrically about the control chamber corresponding portion 30.

Referring to FIG. 1 and FIG. 2, a portion of each casing heat-dissipating hole 20 is parallel to the rear portion 1100 of the high-brightness display unit 1000, and another portion of each casing heat-dissipating hole 20 is perpendicular to the rear portion 1100 of the high-brightness display unit 1000; hence, if any side of the high-brightness display unit 1000 is fixed to the wall W and thus hidden by the wall W, the casing heat-dissipating holes 20 disposed on the aforesaid side of the high-brightness display unit 1000 will only be partially hidden by the wall W. Therefore, the air within the gap 11 can still be discharged from another portion of the casing heat-dissipating holes 20 disposed on the aforesaid side of the high-brightness display unit 1000.

In conclusion, due to its aforesaid technical features, the present invention provides a heat-dissipating structure mounted on the back of a display unit to dissipate heat efficiently from the rear portion of the high-brightness display unit.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:
1. A heat-dissipating structure mounted on a back of a display unit, for use at a rear portion of a high-brightness display unit, the heat-dissipating structure comprising:
   a casing covering the rear portion of the high-brightness display unit and separated from the rear portion of the high-brightness display unit by a gap;
   a plurality of casing heat-dissipating holes penetratingly disposed at a periphery of the casing and communicating with the gap, wherein each said casing heat-dissipating hole has is a portion thereof parallel to the rear portion of the high-brightness display unit and another portion thereof perpendicular to the rear portion of the high-brightness display unit;
   a control chamber corresponding portion protrudingly disposed at the casing, facing away from the rear portion of the high-brightness display unit to receive a control chamber electrically connected to the high-brightness display unit, and having an opening in communication with the gap;
   a plurality of control chamber heat-dissipating holes penetratingly disposed at the control chamber corresponding portion and communicating with the gap through the opening;
   a plurality of fan corresponding portions penetratingly disposed at the casing, communicating with the gap, and each rising in a direction away from the rear portion of the high-brightness display unit, wherein the control chamber corresponding portion is separate from and disposed between the plurality of fan corresponding portions; and
   a plurality of fans disposed at the fan corresponding portions, respectively, wherein air introduced into the gap is discharged from the control chamber heat-dissipating holes and the casing heat-dissipating holes; and at least one fan of the plurality of fans, disposed at one of the fan corresponding portions, is for directing an air stream over the rear portion of the high-brightness display and the control chamber for heat dissipation so that at least: a first part of the air stream is directed over the rear portion of the high-brightness display and is discharged from the casing heat-dissipating holes; and a second part of the air stream is directed over the rear portion of the high-brightness display and over the control chamber via the opening, and is discharged from the control chamber heat-dissipating holes.

2. The heat-dissipating structure of claim 1, wherein the control chamber heat-dissipating holes are penetratingly disposed in a sidewall of the control chamber corresponding portion.

3. The heat-dissipating structure of claim 2, wherein the control chamber heat-dissipating holes and the casing heat-dissipating holes are oblong.

4. The heat-dissipating structure of claim 1, wherein the control chamber heat-dissipating holes and the casing heat-dissipating holes are oblong.

5. The heat-dissipating structure of claim 1, wherein the control chamber heat-dissipating holes and the casing heat-dissipating holes are of a dimension of less than 2.5 mm.

6. The heat-dissipating structure of claim 2, wherein the control chamber heat-dissipating holes and the casing heat-dissipating holes are of a dimension of less than 2.5 mm.

7. The heat-dissipating structure of claim 3, wherein the control chamber heat-dissipating holes and the casing heat-dissipating holes are of a dimension of less than 2.5 mm.

8. The heat-dissipating structure of claim 4, wherein the control chamber heat-dissipating holes and the casing heat-dissipating holes are of a dimension of less than 2.5 mm.

9. The heat-dissipating structure of claim 5, wherein the fan corresponding portions are penetratingly disposed in the casing and arranged symmetrically about the control chamber corresponding portion.

10. The heat-dissipating structure of claim 6, wherein the fan corresponding portions are penetratingly disposed in the casing and arranged symmetrically about the control chamber corresponding portion.

11. The heat-dissipating structure of claim 7, wherein the fan corresponding portions are penetratingly disposed in the casing and arranged symmetrically about the control chamber corresponding portion.

12. The heat-dissipating structure of claim 8, wherein the fan corresponding portions are penetratingly disposed in the casing and arranged symmetrically about the control chamber corresponding portion.

13. The heat-dissipating structure of claim 1, wherein the fan corresponding portions are penetratingly disposed in the casing and arranged symmetrically about the control chamber corresponding portion.

14. The heat-dissipating structure of claim 2, wherein the fan corresponding portions are penetratingly disposed in the casing and arranged symmetrically about the control chamber corresponding portion.

15. The heat-dissipating structure of claim 3, wherein the fan corresponding portions are penetratingly disposed in the casing and arranged symmetrically about the control chamber corresponding portion.

16. The heat-dissipating structure of claim 4, wherein the fan corresponding portions are penetratingly disposed in the casing and arranged symmetrically about the control chamber corresponding portion.

* * * * *